US010193323B2

(12) United States Patent
Hayashi

(10) Patent No.: US 10,193,323 B2
(45) Date of Patent: Jan. 29, 2019

(54) SEMICONDUCTOR DEVICE

(71) Applicant: Mitsubishi Electric Corporation, Tokyo (JP)

(72) Inventor: Kei Hayashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 298 days.

(21) Appl. No.: 14/915,860

(22) PCT Filed: Sep. 6, 2013

(86) PCT No.: PCT/JP2013/074151
§ 371 (c)(1),
(2) Date: Mar. 1, 2016

(87) PCT Pub. No.: WO2015/033449
PCT Pub. Date: Mar. 12, 2015

(65) Prior Publication Data
US 2016/0211657 A1 Jul. 21, 2016

(51) Int. Cl.
H02H 3/08 (2006.01)
H03K 17/14 (2006.01)
(Continued)

(52) U.S. Cl.
CPC ............ *H02H 3/08* (2013.01); *H03K 17/0828* (2013.01); *H03K 17/14* (2013.01); *H03K 17/0826* (2013.01); *H03K 2017/0806* (2013.01)

(58) Field of Classification Search
USPC .......................... 361/86–87, 93.9–93.9, 103
See application file for complete search history.

(56) References Cited

U.S. PATENT DOCUMENTS 8,760,889 B2 * 6/2014 Maruyama ......... H03K 17/0828
361/93.8
2002/0176215 A1 11/2002 Hiyama et al.
(Continued)

FOREIGN PATENT DOCUMENTS

CN 103036542 A 4/2013
JP H03-40517 A 2/1991
(Continued)

OTHER PUBLICATIONS

Office Action dated Jun. 13, 2017 from corresponding JP Appl No. 2015-535243, with partial English language translation, 4 pp.
Notification of Transmittal of Translation of the International Preliminary Report on Patentability and ranslation of Written Opinion of the International Searching Authority; PCT/JP2013/074151 dated Mar. 17, 2016.
International Search Report issued in PCT/JP2013/074151; dated Oct. 1, 2013.
(Continued)

Primary Examiner — Danny Nguyen
(74) Attorney, Agent, or Firm — Studebaker & Brackett PC

(57) ABSTRACT

A semiconductor device includes a semiconductor switching element, a correction current voltage generation circuit, a voltage dividing circuit, an overcurrent protection circuit, and a drive circuit. The switching element is capable of outputting a sense current from its sense terminal. A sense resistor receives the sense current from the sense terminal and produces a sense voltage. The correction current voltage generation circuit generates a correction voltage. The voltage dividing circuit can output a corrected sense voltage by performing resistance voltage dividing on the sense voltage and the correction voltage with resistors. The overcurrent protection circuit is supplied with the corrected sense voltage and outputs a halt signal to the drive circuit when the
(Continued)

5 correction voltage generation circuit
8 control circuit
9 drive circuit
10 overcurrent protection circuit corrected sense voltage Vin is higher than a threshold voltage.

4 Claims, 15 Drawing Sheets

(51) Int. Cl.
*H03K 17/082* (2006.01)
*H03K 17/08* (2006.01)

(56) References Cited

U.S. PATENT DOCUMENTS

| | | |
|---|---|---|
| 2005/0099751 A1 | 5/2005 | Kumagai |
| 2008/0100978 A1 | 5/2008 | Maebara et al. |
| 2008/0198526 A1 | 8/2008 | Hiyama |
| 2013/0083442 A1 | 4/2013 | Hiyama |

FOREIGN PATENT DOCUMENTS

| | | |
|---|---|---|
| JP | 2002-353795 A | 12/2002 |
| JP | 2005-151631 A | 6/2005 |
| JP | 2006-211834 A | 8/2006 |
| JP | 2008-136335 A | 6/2008 |
| JP | 2008-206348 A | 9/2008 |
| JP | 2013-077976 A | 4/2013 |

OTHER PUBLICATIONS

Office Action; "Notification of Reason for Rejection" issued by the Japanese Patent Office dated Nov. 29, 2016, hich corresponds to Japanese Patent Application No. 2015-535243 and is related to U.S. Appl. No. 14/915,860; with English language partial translation.

An Office Action issued by Chinese Patent Office dated Dec. 28, 2017, which corresponds to Chinese Patent Application No. 201380079394.8 and is related to U.S. Appl. No. 14/915,860.

* cited by examiner

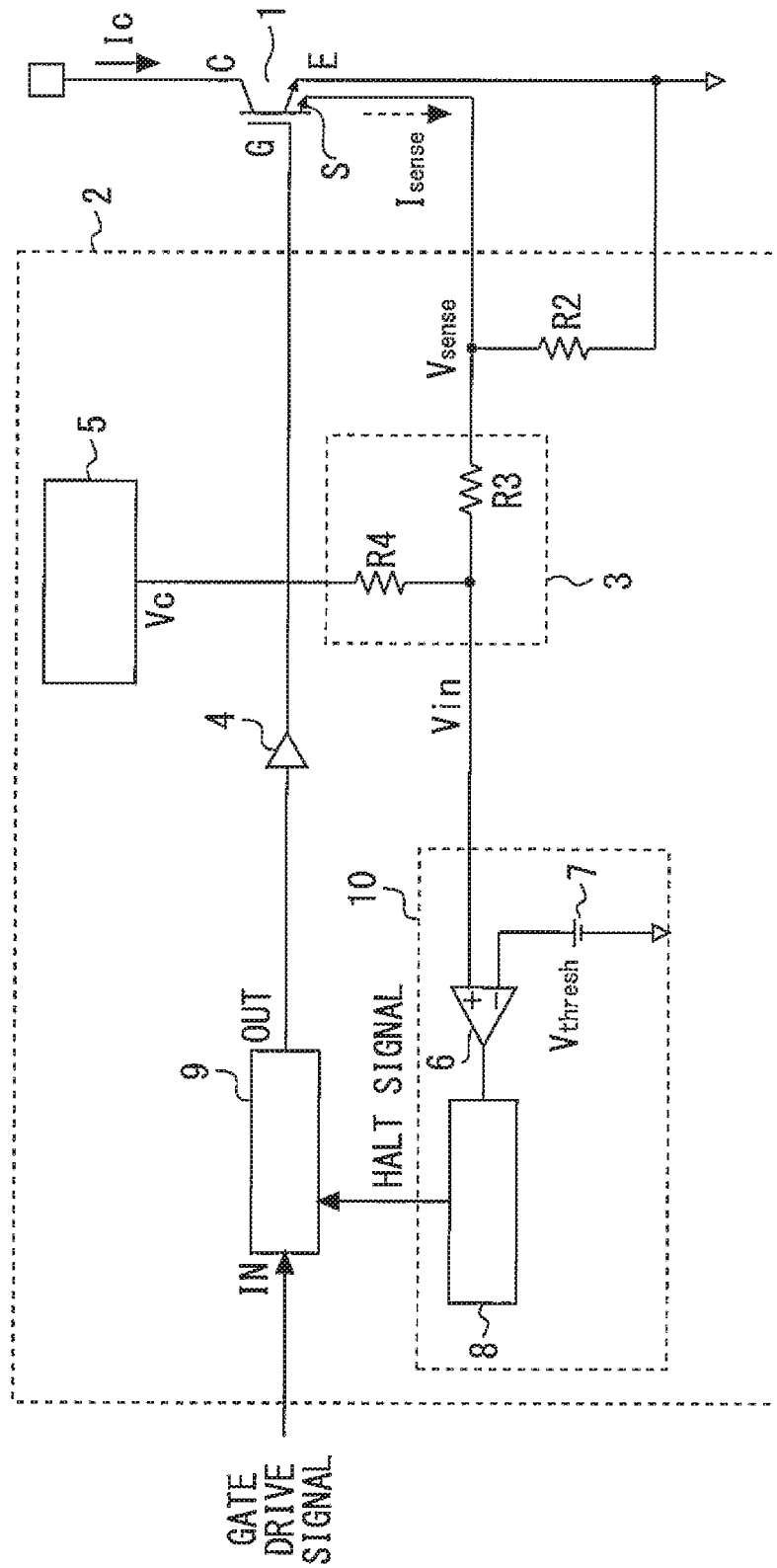

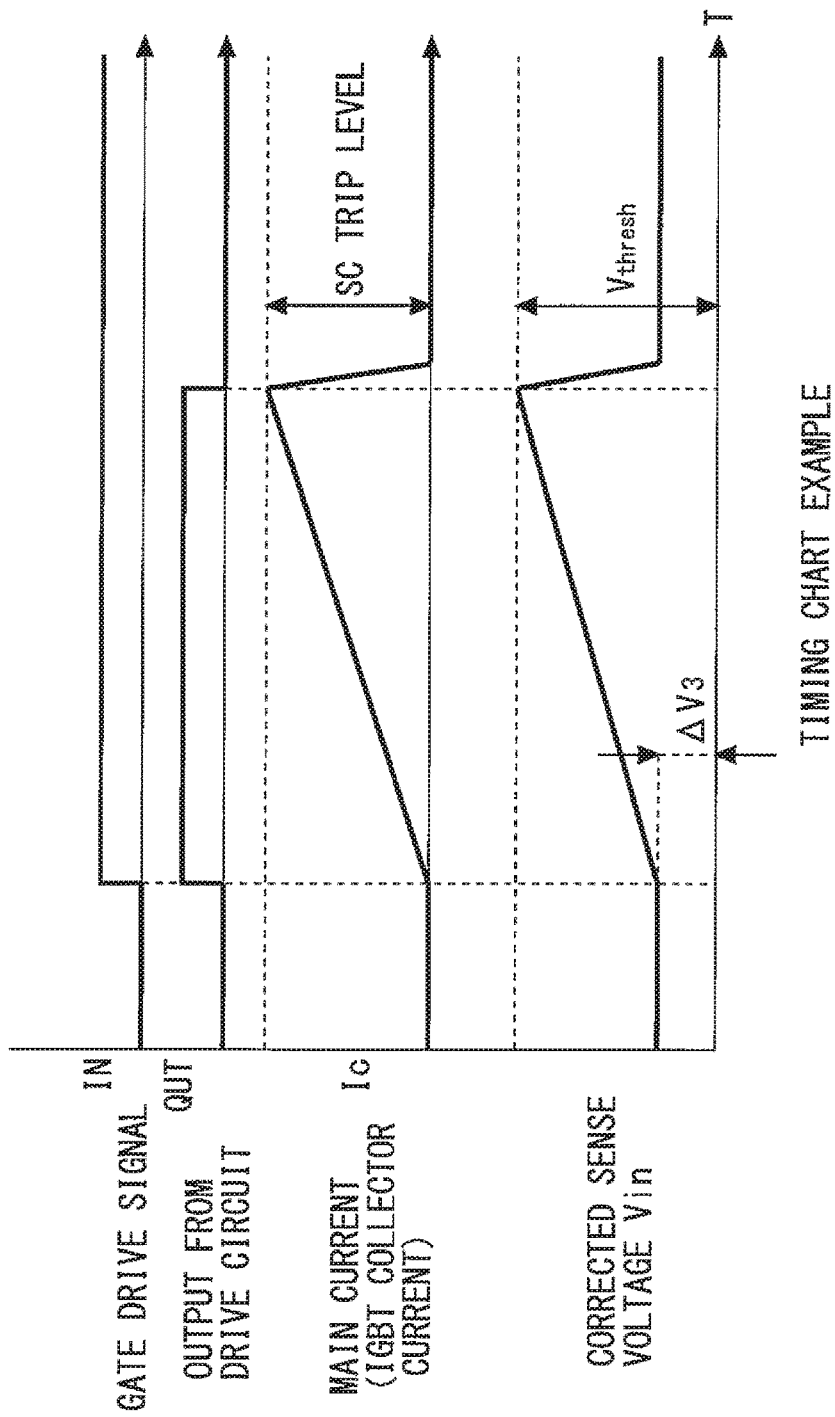

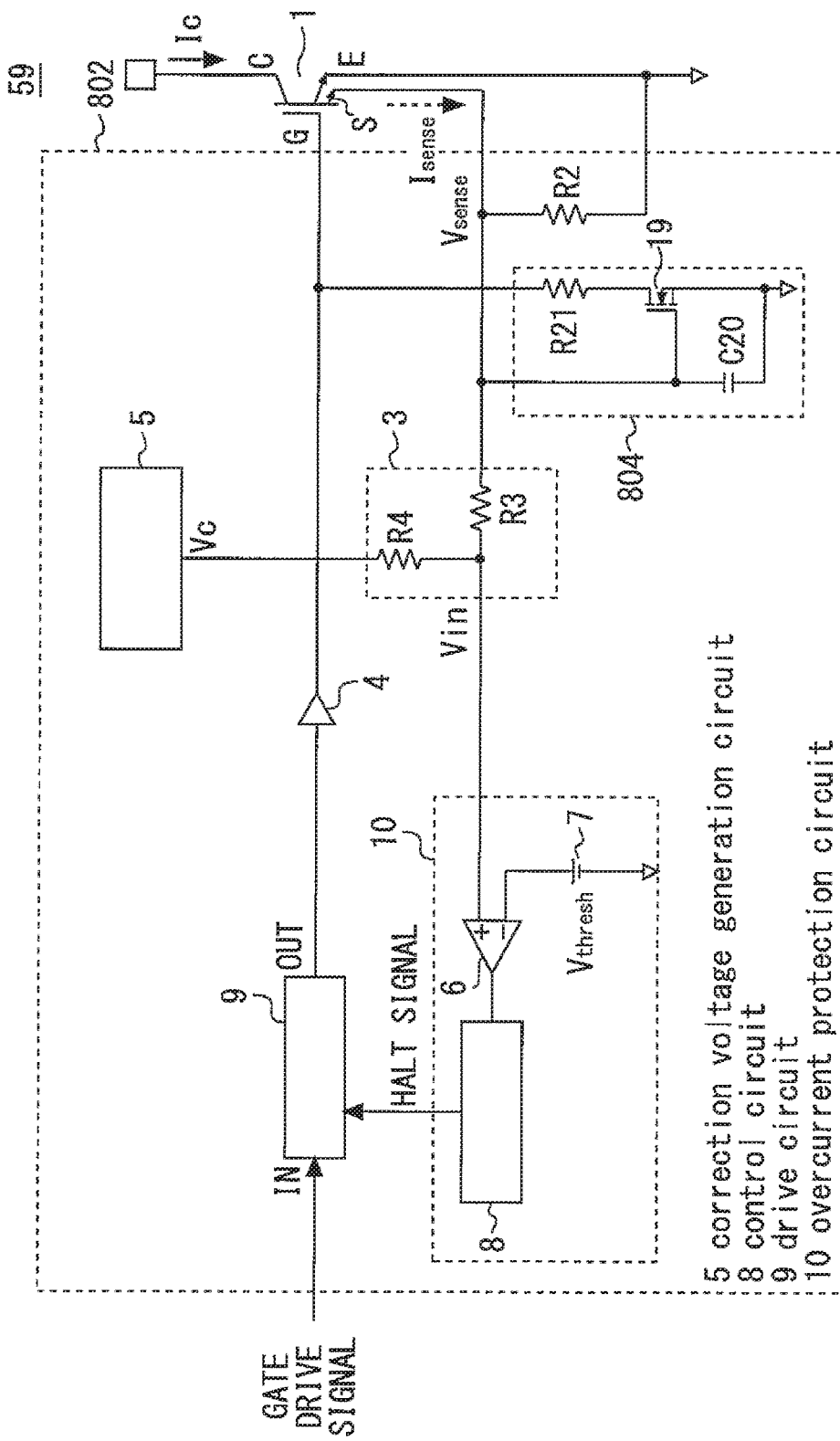

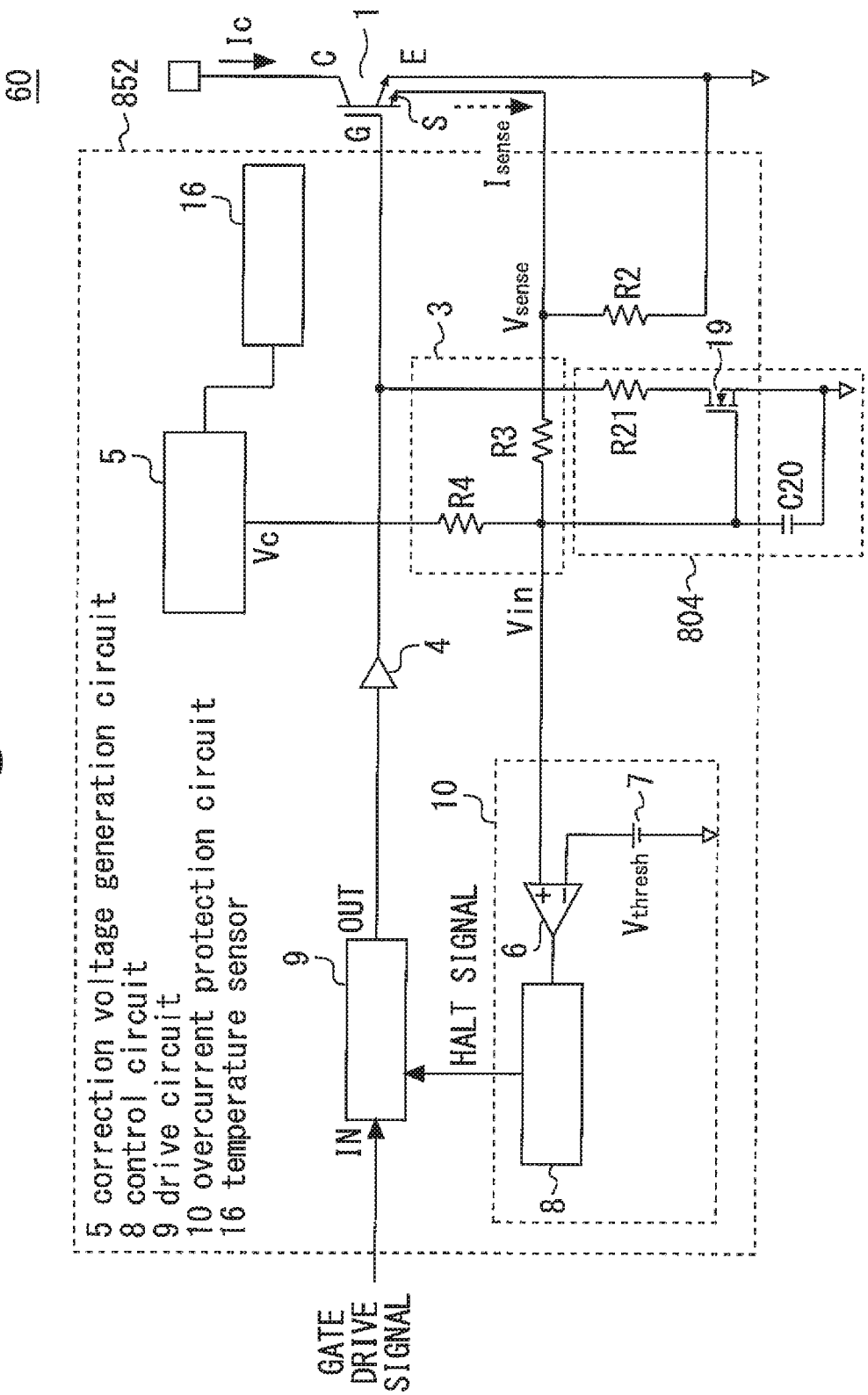
F i g. 1 4

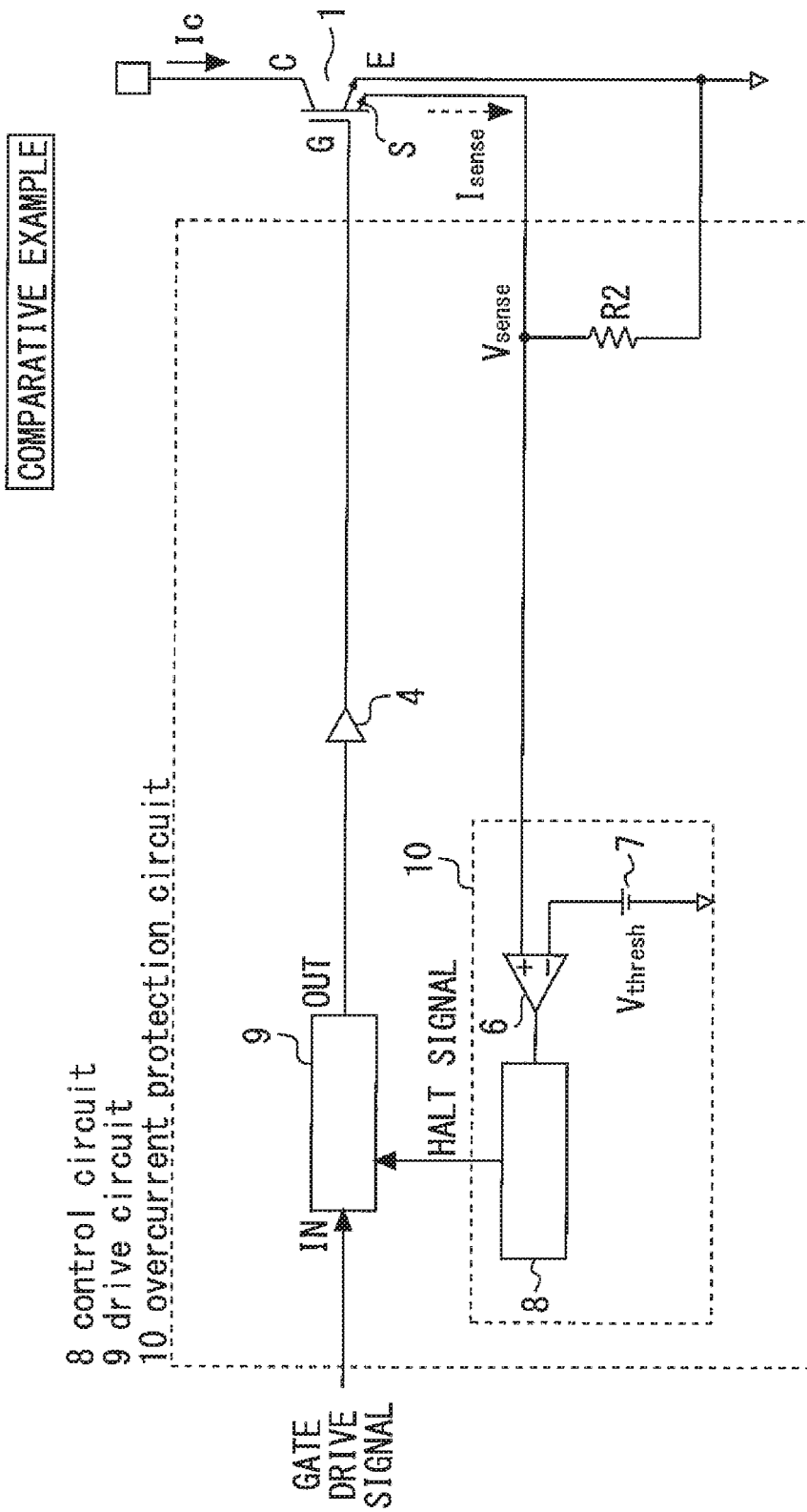
F i g . 1 5

SEMICONDUCTOR DEVICE

TECHNICAL FIELD

The present invention relates to a semiconductor device and a semiconductor switching element drive device.

BACKGROUND ART

A semiconductor device with an overcurrent protection circuit such as one disclosed in Japanese Patent Laid-Open No. 2013-77976 is known. Semiconductor devices such as inverters each having a semiconductor switching element (hereinafter referred to simply as "switching element") include ones having an overcurrent protection circuit for protecting the switching element by performing a protecting operation such as shutting off the switching element when a main current flowing through the switching element exceeds a certain level.

Methods for detecting a main current flowing through a switching element include a method of causing part of the main current to flow as a shunt current through an element (cell) for current detection connected in parallel with the switching element and detecting the shunt current (sense current).

The current sense element has the same cell structure as the switching element, is connected in parallel with the switching element and has a certain cell area with respect to the switching element. In general, in semiconductor devices adopting a system using such a current sense element, the size and electrical characteristics of the current sense element are set so that the ratio of the sense current to the main current in the switching element (shunt ratio) is about 1/1000 to 1/100000.

The sense current is converted into a voltage (sense voltage), for example, by using a resistor, and the sense voltage is input to the overcurrent protection circuit. When the sense voltage exceeds a predetermined threshold voltage, the overcurrent protection circuit determines that an overcurrent has flowed through the switching element and performs a protecting operation such as shutting off the switching element, thereby preventing damage to the switching element. The value of the main current through the switching element at which the overcurrent protection circuit starts the protecting operation is called a short-circuit protection trip level (hereinafter referred to as "SC trip level").

A device according to Japanese Patent Laid-Open No. 2008-206348 has an overcurrent protection circuit capable of adjusting the SC trip level without changing a reference voltage. More specifically, a correction current is supplied to the sense resistor. When the correction current is supplied to the sense resistor, the sense current is increased in accordance with a relationship: sense voltage=sense resistor×(sense current+correction current). As a result, the overcurrent protection circuit operates at a lower corrector current in comparison with the case where no correction current is supplied. If the direction of flow of the correction current is reversed, the operating level of the overcurrent protection circuit can be increased.

When the element temperature of the switching element varies, the SC trip level varies. That is, there is an SC trip level-temperature characteristic. In this respect, in the device according to Japanese Patent Laid-Open No. 2008-206348, the correction current is changed in proportion to the element temperature of the switching element so that the SC trip level is constantly maintained even when the element temperature varies. A semiconductor device capable of adjusting the operating level of the overcurrent protection circuit is thus obtained.

CITATION LIST

Patent Literature

Patent Literature 1
  Japanese Patent Laid-Open No. 2013-77976
Patent Literature 2
  Japanese Patent Laid-Open No. 2006-211834
Patent Literature 3
  Japanese Patent Laid-Open No. 2005-151631
Patent Literature 4
  Japanese Patent Laid-Open No. 2002-353795
Patent Literature 5
  Japanese Patent Laid-Open No. 2008-206348

SUMMARY OF INVENTION

Technical Problem

As described above, an SC trip level-temperature characteristic is exhibited. With the device according to Japanese Patent Laid-Open No. 2008-206348, a correction current generation circuit for supplying the correction current for correcting this temperature characteristic is schematically disclosed. However, there is a problem of the mount area and cost being increased because a complex and large-scale circuit is required to generate the correction current.

The present invention has been achieved to solve the above-described problem, and an object of the present invention is to provide a semiconductor device and a semiconductor switching element drive device simpler in construction and capable of adjusting the SC trip level without changing a reference voltage.

Solution to Problem

A semiconductor device according to the present invention includes:
  a semiconductor switching element capable of outputting from its sense terminal a sense current given at a predetermined shunt ratio to a main current;
  a sense resistor having one end connected to the sense terminal, having the other end grounded, and receiving a current from the sense terminal to generate a sense voltage;
  a correction voltage generation circuit which generates a correction voltage;
  a voltage dividing circuit including a first resistor which receives the sense voltage at its one end and a second resistor which receives at its one end the correction voltage from the correction voltage generation circuit, and whose other end is connected to the other end of the first resistor, the voltage dividing circuit outputting from the point of connection between the first and second resistors a corrected sense voltage obtained by correcting the sense voltage with the correction voltage; and
  an overcurrent protection circuit to which the corrected sense voltage is input, and which outputs a halt signal when the corrected sense voltage is higher than a threshold voltage; and a drive circuit which stops driving of the semiconductor switching element upon receiving the halt signal from the overcurrent protection circuit.

A semiconductor switching element drive device according to the present invention drives a semiconductor switching element capable of outputting from its sense terminal a sense current given at a predetermined shunt ratio to a main current, and the semiconductor switching element drive device includes:

a correction voltage generation circuit which generates a correction voltage;

a voltage dividing circuit including a first resistor which receives at its one end a sense voltage proportional to the sense current and a second resistor which receives at its one end the correction voltage from the correction voltage generation circuit, and whose other end is connected to the other end of the first resistor, the voltage dividing circuit outputting from the point of connection between the first and second resistors a corrected sense voltage obtained by correcting the sense voltage with the correction voltage;

an overcurrent protection circuit to which the corrected sense voltage is input, and which outputs a halt signal when the corrected sense voltage is higher than a threshold voltage; and a drive circuit which stops driving of the semiconductor switching element upon receiving the halt signal from the overcurrent protection circuit.

Advantageous Effects of Invention

According to the present invention, a simple construction enables adjustment of the SC trip level by using a voltage dividing circuit without changing a reference voltage.

BRIEF DESCRIPTION OF DRAWINGS

FIG. 1 is a diagram showing a semiconductor device and a semiconductor switching element drive device according to Embodiment 1 of the present invention.

FIG. 2 is a timing chart showing the operation of the semiconductor device and a semiconductor switching element drive device according to Embodiment 1 of the present invention.

FIG. 13 is a diagram showing a semiconductor device and a semiconductor switching element drive device according to Embodiment 9 of the present invention.

FIG. 14 is a diagram showing a semiconductor device and a semiconductor switching element drive device according to a modified example of Embodiment 9 of the present invention.

FIG. 15 is a diagram showing the comparative example compared with the embodiment of the present invention.

DESCRIPTION OF EMBODIMENTS

Embodiment 1

Figure 3:
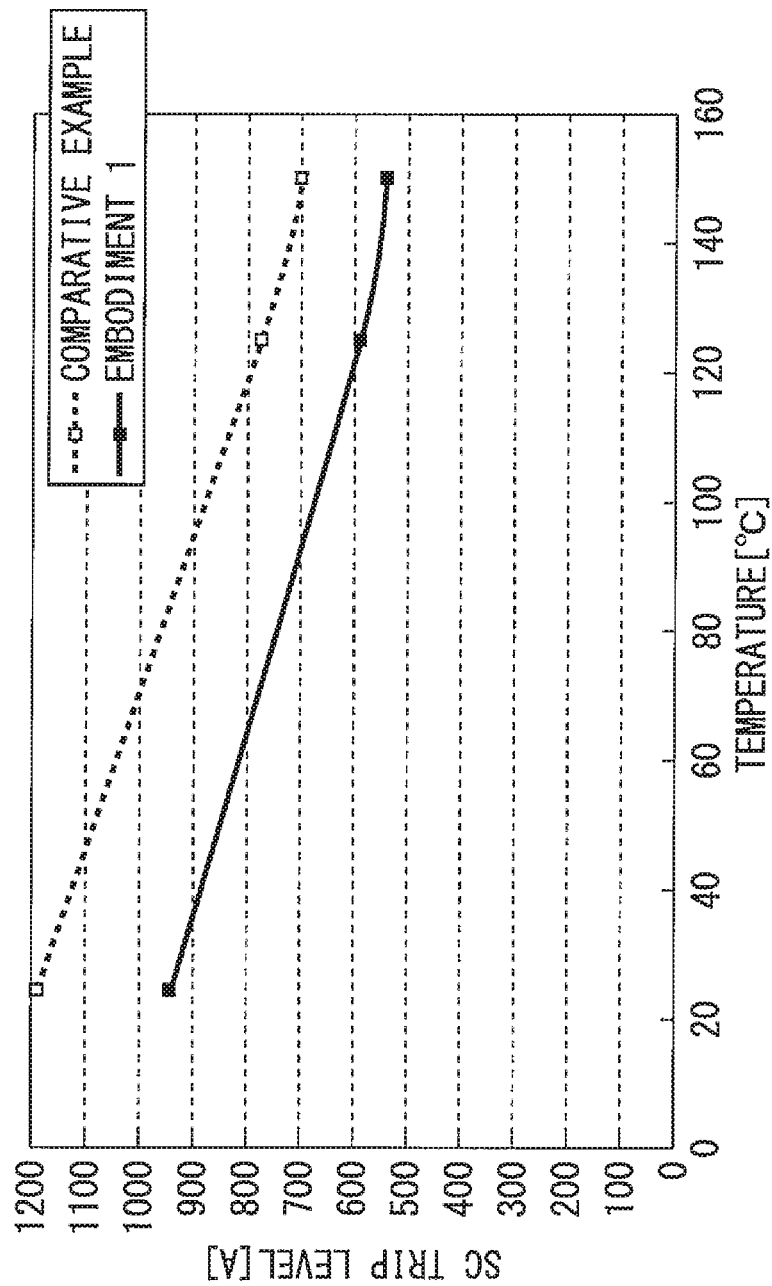
FIG. 3 is a diagram showing a result of measurement of the SC trip level in the semiconductor device and the drive device according to Embodiment 1 of the present invention.

Configuration of Device According to Embodiment 1

FIG. 1 is a diagram showing a semiconductor device 51 and a semiconductor switching element drive device 2 according to Embodiment 1 of the present invention. The semiconductor device 51 includes a semiconductor switching element 1 (hereinafter referred to also simply as "switching element 1"), a correction voltage generation circuit 5, a voltage dividing circuit 3, a buffer 4, a sense resistor R2, an overcurrent protection circuit 10, and a drive circuit 9. The drive device 2 has the components of the semiconductor device 51 except the switching element 1, i.e., the correction voltage generation circuit 5, the voltage dividing circuit 3, the buffer 4, the sense resistor R2, the drive circuit 9 and the overcurrent protection circuit 10.

The semiconductor device 51 has the above-described semiconductor element and circuits mounted in a casing not shown. The overcurrent protection circuit 10 and the drive circuit 9 in the drive device 2 may be integrated as a driver IC. In such a case, the buffer 4 may further be integrated in the driver IC. The voltage dividing circuit 3 and the correction voltage generation circuit 5 may also be integrated in the driver IC.

A freewheeling diode, not shown in the diagram, is connected to the switching element 1. In FIG. 1, only one switching element 1 is shown for simplification of description. However, the present invention is not limited to the form illustrated in this way. In the semiconductor device 51 provided as an actual product, a plurality of units each corresponding to the circuit arrangement shown in FIG. 1 may be provided to drive a plurality of switching elements 1. In such a case, the plurality of switching elements 1 may constitute arm circuits.

The switching element 1 is an insulated-gate bipolar transistor (IGBT) formed of silicon. The switching element 1 includes a collector terminal C, an emitter terminal E, a gate terminal G and a sense terminal S. The gate terminal G is connected to the output terminal of the drive circuit 9.

The switching element 1 includes the sense terminal S. The switching element 1 has a cell separation structure such that a sense current $I_{sense}$ can be output from the sense terminal S. The sense current $I_{sense}$ is a current given at a predetermined shunt ratio with respect to a collector current (main current).

This cell separation structure is such that a current sense element and the sense terminal S are provided on a semiconductor chip together with the cell structure of the main IGBT element. The current sense element is an element having the same structure as the main cell structure and having a reduced cell area. The sense terminal S is a terminal for outputting the sense current $I_{sense}$.

This kind of cell separation structure is a well-known art disclosed, for example, in Japanese Patent Laid-Open No. 2008-206348. The shunt ratio of the sense current $I_{sense}$ is determined by the cell area ratio between the area of the main cell structure and the area of the current sense element. When a collector current Ic flows in the switching element 1, part of the collector current Ic is output as sense current $I_{sense}$ from the sense terminal S.

One end of the sense resistor R2 is connected to the sense terminal S while the other end is grounded. The sense resistor R2 receives the sense current $I_{sense}$ from the sense terminal S to produce a sense voltage $V_{sense}$.

The correction voltage generation circuit 5 generates a correction voltage Vc. The correction voltage generation circuit 5 is a circuit for stably outputting the correction voltage Vc as a predetermined correction reference voltage.

The voltage dividing circuit 3 has a resistor R3 and a resistor R4 connected in series. The resistor R3 has its one end connected between the sense terminal S and the sense resistor R2. The resistor R3 thereby receives the sense voltage $V_{sense}$ at its one end. One end of the resistor R4 is connected to an output terminal of the correction voltage generation circuit 5. The resistor R4 receives at this end the correction voltage Vc from the correction voltage generation circuit 5. The other end of the resistor R3 and the other end of the resistor R4 are connected to each other.

The voltage dividing circuit 3 can output a corrected sense voltage Vin from the point of connection between the resistors R3 and R4. The corrected sense voltage Vin is a result of correction of the sense voltage $V_{sense}$ by the correction voltage Vc.

It is preferable that each of the resistor R3 and the resistor R4 have a resistance value larger than the resistance value of the sense resistor R2. The current flowing through the resistor R3 from the correction voltage Vc and the sense terminal S is sufficiently smaller than the sense current $I_{sense}$ flowing through the sense resistor R2. Therefore, its influence on the sense voltage $V_{sense}$ may be ignored.

The overcurrent protection circuit 10 receives the corrected sense voltage Vin, and outputs a halt signal when the corrected sense voltage Vin is higher than a threshold voltage $V_{thresh}$. More specifically, the overcurrent protection circuit 10 includes a comparator 6, a reference voltage generation circuit 7 and a control circuit 8. The comparator 6 receives the corrected sense voltage Vin at its plus input terminal and receives the threshold voltage $V_{thresh}$ at its minus input terminal. When the corrected sense voltage Vin exceeds the threshold voltage $V_{thresh}$, the comparator 6 inverts an output signal from low to high. The control circuit 8 generates the halt signal with the inversion of the output signal from the comparator 6 used as a trigger.

When the drive circuit 9 receives the halt signal from the overcurrent protection circuit 10, it stops driving of the switching element 1. More specifically, an input terminal of the drive circuit 9 is connected to an external microcomputer or the like, and a gate drive signal IN is input therethrough.

The output terminal of the drive circuit 9 is connected to the gate terminal of the switching element 1 through the buffer 4.

The above-described overcurrent protection circuit 10 determines that an overcurrent has flowed through the switching element 1 when the corrected sense voltage Vin exceeds the threshold voltage $V_{thresh}$, and performs a protecting operation by shutting off the switching element 1. Damage to the switching element 1 by the overcurrent is prevented thereby. The value of the main current (i.e., collector current Ic) in the switching element 1 at which the overcurrent protection circuit 10 starts the protecting operation is called a short-circuit protection trip level (hereinafter referred to as "SC trip level").

Operation of Device According to Embodiment 1

Adjustment of SC Trip Level

The operations of the semiconductor device 51 and the drive device 2 will be described with reference to FIG. 2. FIG. 2 is a timing chart showing the operation of the circuit shown in FIG. 1. During normal operation, the corrected sense voltage Vin is lower than the threshold voltage $V_{thresh}$. In this case, the output of the comparator 6 is low and the halt signal is not output from the control circuit 8 to the drive circuit 9. At this time, the drive circuit 9 drives the switching element 1 according to the gate drive signal.

When the collector current Ic of the switching element 1 becomes equal to or higher than a predetermined value (i.e., the SC trip level), the corrected sense voltage Vin exceeds the threshold voltage $V_{thresh}$. The output of the comparator 6 is then inverted from low to high.

With this change, the overcurrent protection circuit 10 outputs the halt signal. That is, the overcurrent protection circuit 10 outputs the halt signal when the corrected sense voltage Vin is higher than the threshold voltage $V_{thresh}$.

When the drive circuit 9 receives the halt signal from the overcurrent protection circuit 10, it stops driving of the switching element 1 regardless of whether the gate drive signal IN is high or low.

The corrected sense voltage Vin consists of the sense voltage $V_{sense}$ generated with the resistor R2 and voltage dividing output of the correction voltage Vc. The corrected sense voltage Vin is computed by the following expression (1).

$$Vin = V_{sense} + \frac{R3}{R3+R4} \times (Vc - V_{sense}) \qquad (1)$$
$$= \frac{R4}{R3+R4} \times V_{sense} + \frac{R3}{R3+R4} \times Vc$$

As can be understood from expression (1), $Vin > V_{sense}$ when $Vc > V_{sense}$. As a result, the voltage drop across the resistor R3 is added to $V_{sense}$, thus enabling reducing the SC trip level. Conversely, $Vin < V_{sense}$ when $Vc < V_{sense}$. As a result, the voltage drop across the resistor R3 is subtracted from $V_{sense}$, thus enabling increasing the SC trip level.

The amount of voltage drop ΔV3 can be changed by means of three parameters: the magnitude of correction voltage Vc and the resistance values of the resistors R3 and R4. Therefore, the SC trip level can be easily adjusted in comparison with single parameter control using only the resistance value of the sense resistor R2.

Functions and Effects of Device According to Embodiment 1

Functions and effects of the semiconductor device 51 and the drive device 2 according to Embodiment 1 will be described below.

Since (gate-sense voltage $V_{GS}$) of the current sense element=(switching element gate–emitter voltage $V_{GE}$)–(sense voltage), $V_{GE}$ of the switching element and $V_{GS}$ of the current sense element are not equal to each other. Similarly, the collector-emitter voltage $V_{CE}$ of the switching element and the collector-sense voltage $V_{CS}$ of the current sense element are not equal to each other.

Accordingly, the relationship shown by the expression (2) below is not established.

$$\frac{\text{Current sense element cell area}}{\text{Switching element cell area}} = \frac{\text{Sense current}}{\text{Switching element current}} \quad (2)$$

Since an IGBT or a MOSFET has a gate threshold-temperature characteristic, the magnitude of influence of the difference between the bias voltages of the switching element and the current sense element on the relationship shown by the expression (3) below changes depending on the element temperature.

$$\text{Shunt ratio} = \frac{\text{Sense current}}{\text{Switching element current}} \quad (3)$$

This means that the shunt ratio changes depending on the element temperature. This tendency becomes more noticeable if the $V_{sense}$ is increased. The conventional semiconductor devices therefore have the problem that the SC trip levels vary when the element temperature of the switching element varies.

(2) Problem of Comparator-Side Input Voltage Range

As described above, it is preferable to make the sense voltage $V_{sense}$ as small as possible. However, if the sense voltage $V_{sense}$ is made excessively low, another problem arises in a case where the sense voltage $V_{sense}$ is directly compared by a comparator.

The problem is that the sense voltage $V_{sense}$ becomes excessively low with respect to the input voltage range of the comparator. If the sense voltage $V_{sense}$ is directly input to the comparator 6 in Embodiment 1, it is necessary that the comparator 6 directly compares the sense voltage $V_{sense}$ and the threshold voltage $V_{thresh}$.

As a comparator capable of handling an input voltage of several hundred millivolts such as described above, a circuit configuration capable of being used substantially from zero volt, e.g., one capable of a rail-to-rail input is required. Thus, there is a problem that the comparator to be used in the overcurrent protection circuit is limited to a particular type.

(3) Compatibility Between Low Sense Voltage and Comparator Input Voltage Range

As described above, there is a first demand for reducing the sense voltage $V_{sense}$ so that a change in SC trip level with respect to temperature is small. On the other hand, there is a second demand for setting high the input voltage range of the comparator 6. In Embodiment 1, both the first and second demands can be met.

In Embodiment 1, the voltage dividing resistance value of the voltage dividing circuit 3 can be adjusted independently of the resistance value of the sense resistor R2. In the voltage dividing circuit 3, the resistor R3 is inserted in series between one end of the sense resistor R2 and the plus input terminal of the comparator 6. In the arrangement thus made, a voltage drop occurs across the resistor R3 and the amount of this voltage drop ΔV3 is added to the sense voltage $V_{sense}$. That is, the corrected sense voltage Vin can be generated by adding the amount of voltage drop ΔV3 to the sense voltage $V_{sense}$.

The amount of voltage drop ΔV3 can be made sufficiently large if the correction voltage Vc and the voltage dividing resistance value of the voltage dividing circuit 3 are adjusted. For example, the voltage dividing circuit 3 and the correction voltage generation circuit 5 may be constructed so that the corrected sense voltage Vin is a comparatively high voltage of one to several volts for the threshold voltage of the overcurrent protection circuit.

(4) Improvement of SC Trip Level-Temperature Characteristic

FIG. 3 is a diagram showing a result of measurement of the SC trip level in the semiconductor device 51 and the drive device 2 according to Embodiment 1 of the present invention. The result shown in FIG. 3 is a result of measurement of an element temperature dependence of the SC trip level in the semiconductor device 51 according to Embodiment 1. FIG. 3 also shows a result of measurement of an element temperature dependence of the SC trip level in a comparative example shown in FIG. 15.

The abscissa represents the element temperature of the switching element 1. The ordinate represents the SC trip level, more specifically the value of the main current (i.e., collector current Ic) in the switching element 1 at which the overcurrent protection circuit 10 starts the protecting operation.

FIG. 15 is a diagram showing the comparative example compared with the embodiment of the present invention. In the comparative example shown in FIG. 15, the voltage dividing circuit 3 and the correction voltage generation circuit 5 are not provided. Excepting this difference, the circuit in the comparative example is the same as that of the semiconductor device 51 according to Embodiment 1 shown in FIG. 1.

As shown in FIG. 3, by adding the amount of voltage drop ΔV3 across the resistor R3 to the sense voltage $V_{sense}$, a correction effect in correction with respect to the amount of change in temperature is obtained as well as a level correction to the SC trip level. The level correction will first be described. In the characteristic graph for the comparison example shown in FIG. 3, the SC trip level at the element temperature 25° C. is 1190 A. On the other hand, the SC trip level at the element temperature 25° C. in the semiconductor device 51 according to Embodiment 1 is 940 A. As can be understood from FIG. 3, the SC trip level value in Embodiment 1 is reduced as a whole in comparison with the comparative example.

The correction with respect to the amount of change in temperature will be described. The SC trip level at the element temperature 25° C. is reduced from 1190 A to 940 A. While the amount of change in SC trip level from the element temperature 25° C. to the element temperature 125° C. in the comparative example is −490 A, the corresponding change in Embodiment 1 is −400 A. The amount of change in SC trip level in the same temperature range is reduced by about 90 A. That is, the amount of change in SC trip level with respect to temperature in the same temperature range is reduced, thereby achieving an improvement in SC trip level-temperature characteristic.

In Embodiment 1, the sense voltage $V_{sense}$ can be corrected by the voltage dividing circuit 3. Japanese Patent Laid-Open No. 2008-206348, for example, discloses an SC trip level adjustment technique using not a correction voltage but a correction current. The technique disclosed in this publication requires a comparatively high-priced electronic component such as an operational amplifier for generating a correction current from the correction voltage, and has a problem in terms of cost and mount area. In this respect, in Embodiment 1, the SC trip level can be adjusted by means of the correction voltage Vc and the simple arrangement constituted by the voltage dividing circuit 3 using two resistors R3 and R4.

As described above, the semiconductor device 51 and the drive device 2 according to Embodiment 1 are provided as a practical circuit capable of suitably adjusting the input voltage range of the comparator 6 by using a simple circuit, that is, the correction voltage Vc and the voltage dividing circuit 3. Variations in the SC trip level with changes in temperature can be limited by such a practical circuit.

As shown in FIG. 3, the SC trip level is reduced by setting the correction voltage Vc higher than the sense voltage $V_{sense}$. However, the present invention is not limited to this. The correction voltage Vc may be set lower than the sense voltage $V_{sense}$ to increase the SC trip level.

The correction voltage generation circuit 5 that outputs the correction voltage Vc may be realized by using a predetermined reference voltage and a transimpedance circuit such as an emitter follower. In such a case, the advantage of simplicity of the circuit is obtained.

The switching element 1 is not limited to the IGBT formed of silicon. A power MOSFET formed of silicon or a power MOSFET formed of silicon carbide (SiC) may alternatively be used.

Embodiment 2

Figure 4:
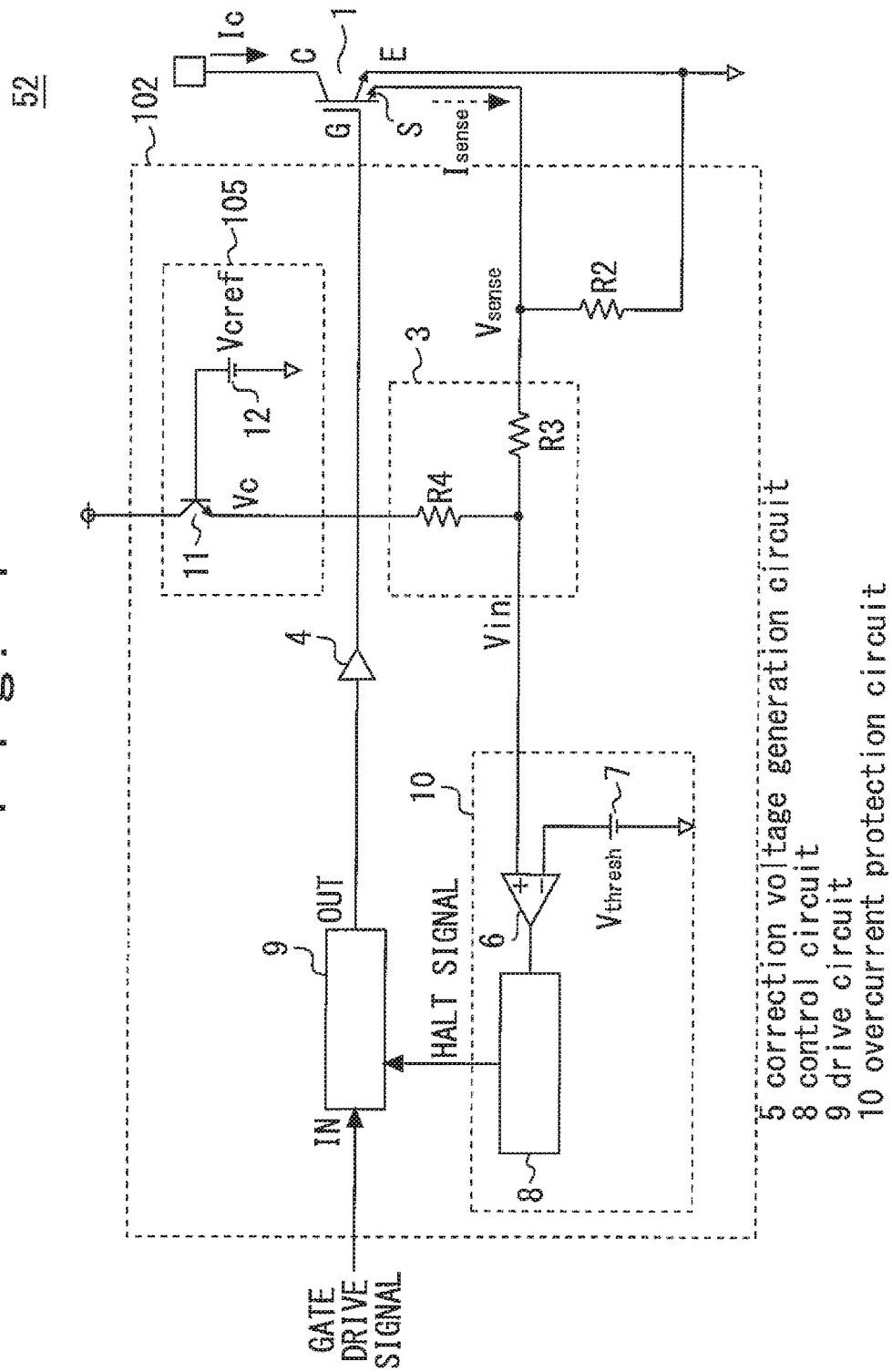
FIG. 4 is a diagram showing a semiconductor device and a semiconductor switching element drive device according to Embodiment 2 of the present invention.

FIG. 4 is a diagram showing a semiconductor device 52 and a semiconductor switching element drive device 102 according to Embodiment 2 of the present invention. The semiconductor device 52 and the drive device 102 are same as the semiconductor device 51 and the drive device 2 according to Embodiment 1 except that the correction voltage generation circuit 5 is replaced with a correction voltage generation circuit 105.

The correction voltage generation circuit 105 includes an NPN transistor 11 as an emitter follower and a reference voltage source 12. The reference voltage source 12 generates a correction reference voltage Vcref. A base terminal of the NPN transistor 11 is connected to the reference voltage source 12. A collector terminal of the NPN transistor 11 is connected to a voltage source, and an emitter terminal of the NPN transistor 11 is connected to the resistor R4.

In Embodiment 2, a circuit of a reduced scale can be constructed because of use of the NPN transistor 11 and the voltage dividing circuit 3 formed by the resistors R3 and R4, and both a reduced cost and a reduced mount area can be achieved.

Embodiment 3

Figure 5:
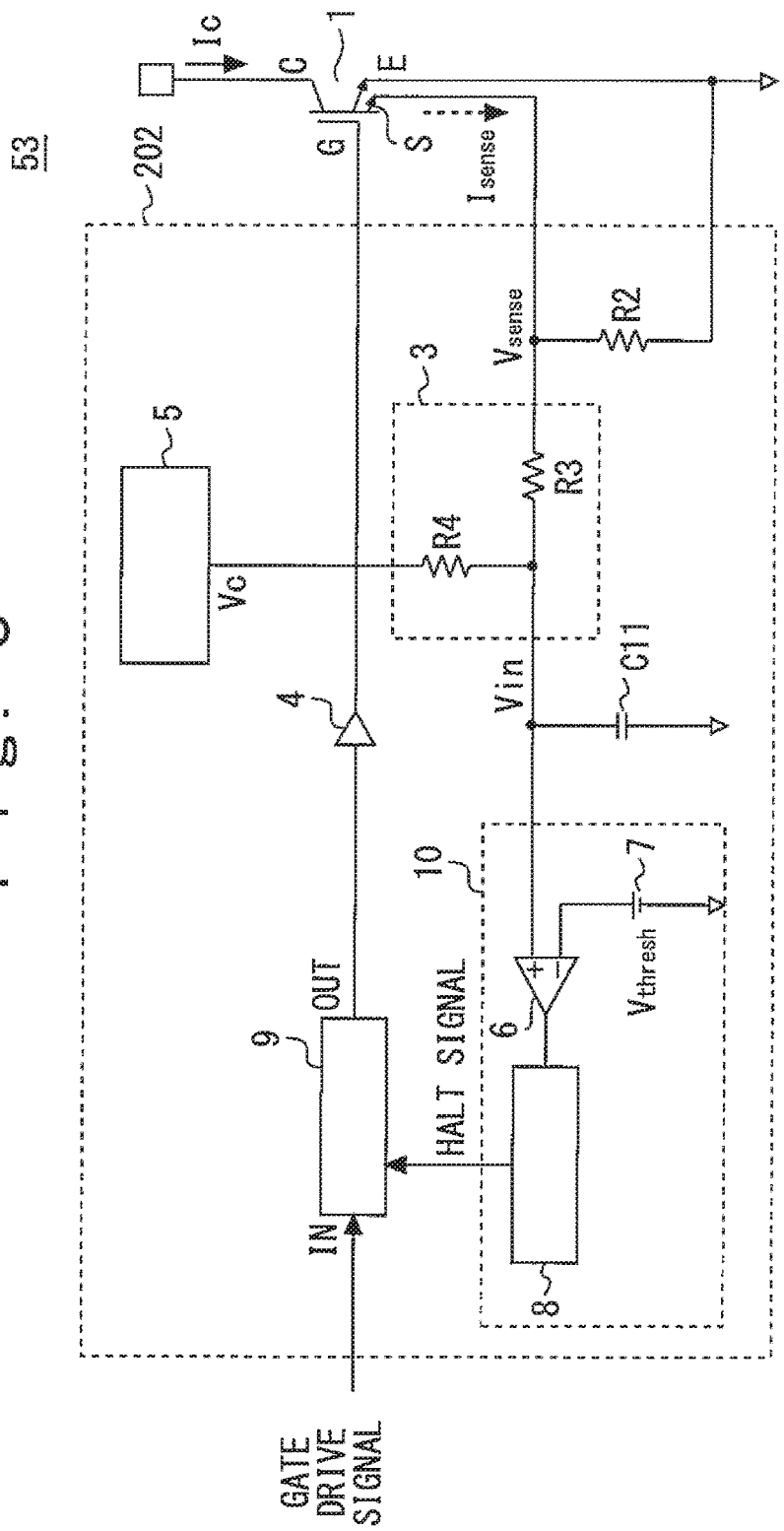
FIG. 5 is a diagram showing a semiconductor device and a semiconductor switching element drive device according to Embodiment 3 of the present invention.

FIG. 5 is a diagram showing a semiconductor device 53 and a semiconductor switching element drive device 202 according to Embodiment 3 of the present invention. The semiconductor device 53 and the drive device 202 are same as the semiconductor device 51 and the drive device 2 according to Embodiment 1 except that a capacitive element C11 is added.

One end of the capacitive element C11 is connected between the input terminal of the overcurrent protection circuit 10 and the point of connection between the resistors R3 and R4. The other end of the capacitive element C11 is grounded. The resistors R3 and R4 and the capacitive element C11 form a low-pass filter. Transient noise can be removed by this low-pass filter. Since the resistors R3 and R4 of the voltage dividing circuit 3 can serve for the low-pass filter, the number of component parts can be reduced.

Embodiment 4

Figure 6:
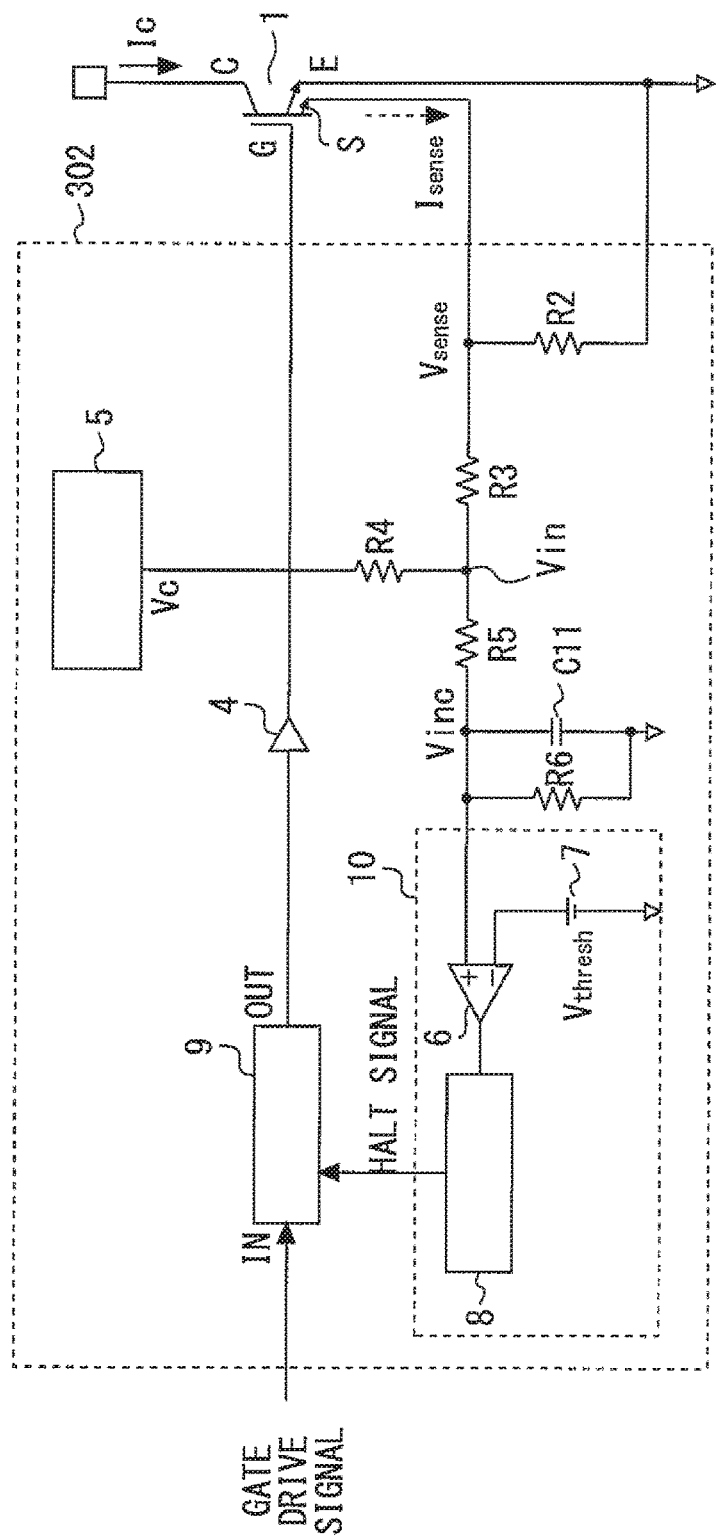
FIG. 6 is a diagram showing a semiconductor device and a semiconductor switching element drive device according to Embodiment 4 of the present invention.

FIG. 6 is a diagram showing a semiconductor device 54 and a semiconductor switching element drive device 302 according to Embodiment 4 of the present invention. The semiconductor device 54 and the drive device 302 are same as the semiconductor device 53 and the drive device 202 according to Embodiment 3 except that a filter resistor R5 and a resistor R6 are added.

The filter resistor R5 for removing transient noise is inserted in series between the voltage dividing circuit 3 and the input terminal of the overcurrent protection circuit 10. The filter resistor R5 is connected to one end of the capacitive element C11 to form a low-pass filter. If the filter resistor R5 is separately disposed, the number of elements is increased. However, the time constant of the low-pass filter may be adjusted by means of the filter resistor R5. Therefore, the resistors R3 and R4 are not limited for the time constant of the low-pass filter, and the voltage dividing circuit 3 can be freely designed. Thus, the degree of design freedom is high.

The resistor R6 is disposed in parallel with the capacitive element C11. One end of the parallel circuit of the resistor R6 and the capacitive element C11 is connected between the input terminal of the overcurrent protection circuit 10 and the filter resistor R5. The other end of the parallel circuit of the resistor R6 and the capacitive element C11 is grounded. In the circuit thus arranged, the resistor R6 and the filter resistor R5 form a resistance voltage dividing circuit and the corrected sense voltage Vin can be further adjusted by voltage dividing.

The voltage obtained by further adjusting the corrected sense voltage Vin by voltage dividing is also referred to as recorrected sense voltage Vinc here. This two-stage sense-voltage adjustment mechanism is particularly effective in Embodiment 10 described below.

It is preferable that the resistance values of the filter resistor R5 and the resistor R6 be set sufficiently larger than the resistance values of the sense resistor R2 and the resistor R3. If the resistance values of the filter resistor R5 and the resistor R6 are sufficiently larger than the resistance values of the sense resistor R2 and the resistor R3. The recorrected sense voltage Vinc, which is the signal input to the overcurrent protection circuit 10, can be approximately expressed by the following expression (4).

$$Vinc = \frac{R6}{R5+R6} \times \left( \frac{R4}{R3+R4} \times V_{sense} + \frac{R3}{R3+R4} \times Vc \right) \quad (4)$$

Embodiment 5

Figure 7:
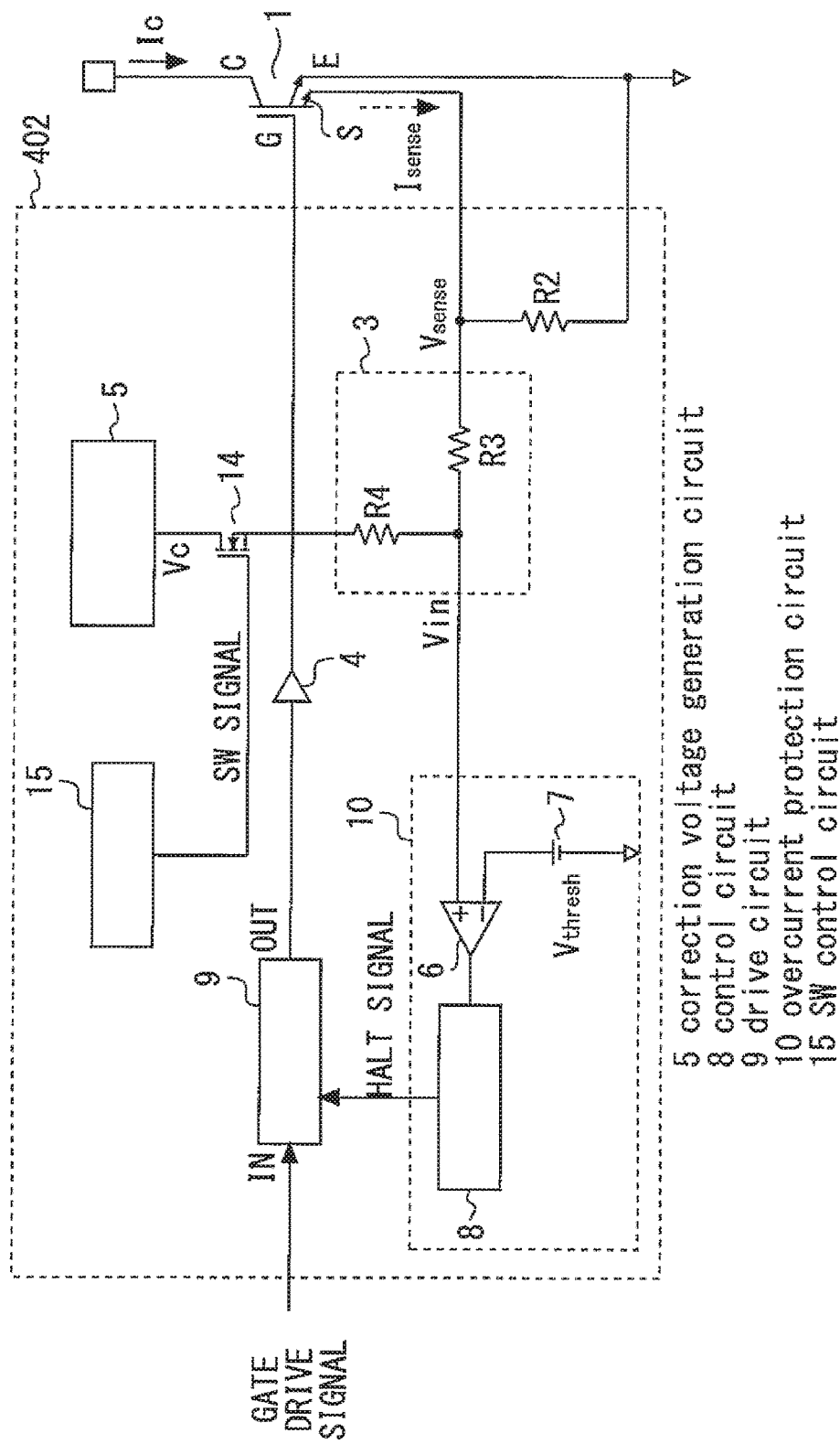
FIG. 7 is a diagram showing a semiconductor device and a semiconductor switching element drive device according to Embodiment 5 of the present invention.

FIG. 7 is a diagram showing a semiconductor device 55 and a semiconductor switching element drive device 402 according to Embodiment 5 of the present invention. The semiconductor device 55 and the drive device 402 are same as the semiconductor device 51 and the drive device 2 according to Embodiment 1 except that a correction voltage switching element 14 and a SW control circuit 15 are added.

The correction voltage switching element 14 is a MOSFET. A gate terminal of the correction voltage switching element 14 is connected to an output of the SW control circuit 15 to receive a SW signal from the SW control circuit 15. The SW signal is a drive signal for turning on/off the correction voltage switching element 14.

A drain terminal of the correction voltage switching element 14 is connected to the correction voltage generation circuit 5 to receive the correction voltage Vc. A source terminal of the correction voltage switching element 14 is connected to one end of the resistor R4. The correction voltage switching element 14 is capable of switching opening and shutting off between the correction voltage generation circuit 5 and the one end of the resistor R4. While the correction voltage switching element 14 shown in FIG. 7 is a MOSFET, a bipolar transistor may alternatively be used.

Figure 8:
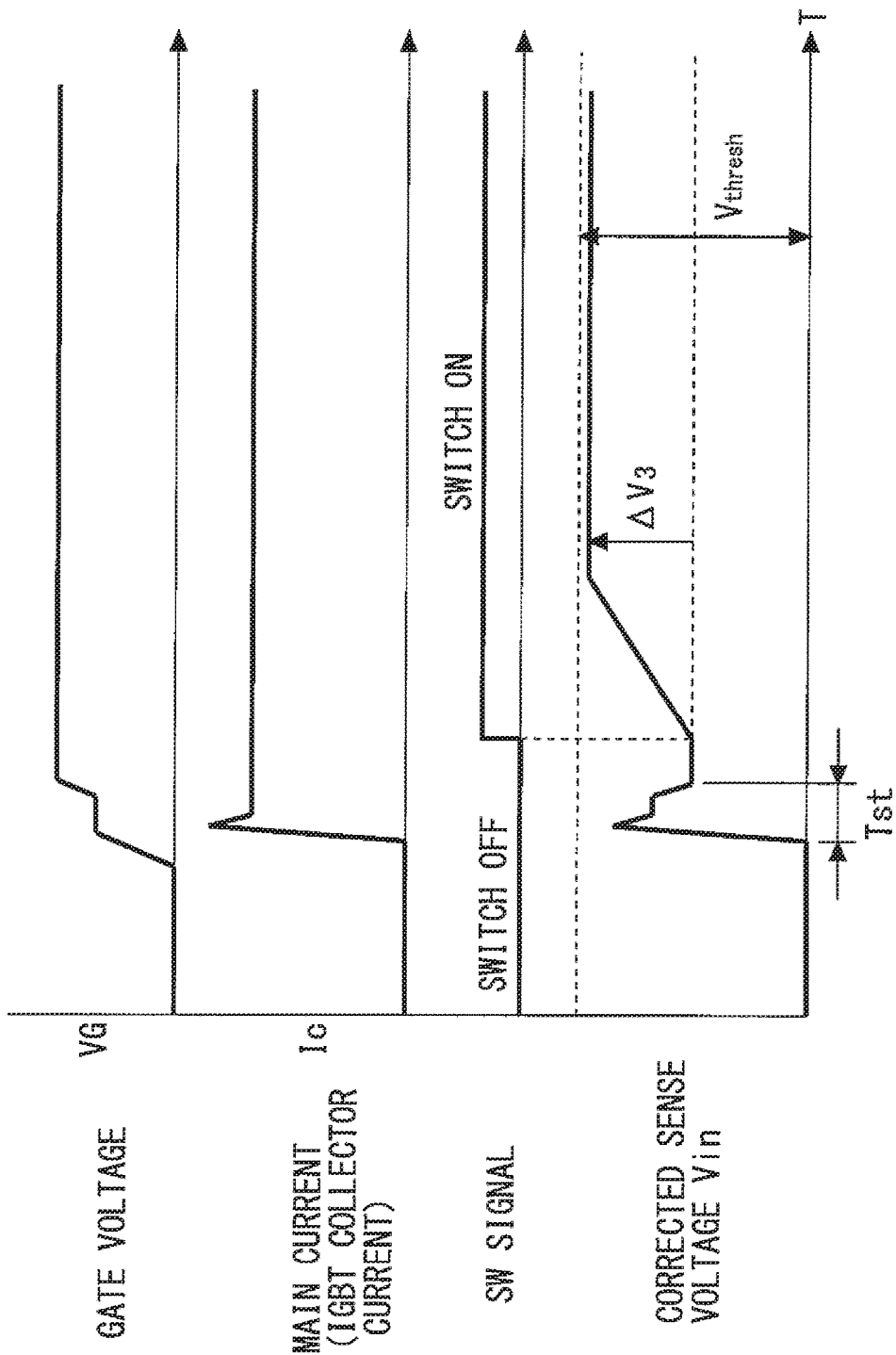
FIG. 8 is a timing chart showing the operations of the semiconductor device and the drive device according to Embodiment 5 of the present invention.

FIG. 8 is a timing chart showing the operations of the semiconductor device 55 and the drive device 402 according to Embodiment 5 of the present invention. In Embodiment 5, the correction voltage switching element 14 is turned on from the off state with a delay from the moment at which the switching element 1 is turned on.

As disclosed in Japanese Patent Laid-Open No. 2013-77976, an interval is recognized in which the sense voltage varies transiently when the switching element 1 is turned on. This interval is a transient period Tst shown in FIG. 8. The correction voltage switching element 14 is turned off in the transient interval Tst and is turned on after passage of the transient interval Tst. The corrected sense voltage Vin is thereby made lower than the threshold voltage $V_{thresh}$ of the overcurrent protection circuit 10 during the transient interval Tst. It is assumed here that correction voltage Vc>sense voltage $V_{sense}$.

The corrected sense voltage Vin can be made lower than the threshold voltage $V_{thresh}$ during the transient interval Tst to prevent the corrected sense voltage Vin from accidentally reaching the SC trip level.

In the above-described circuit according to Embodiment 5, it is ideally possible that there is no need for the low-pass filter used in Embodiment 3 or 4, because transient noise mixing or variations in sense voltage can be made lower than the threshold voltage $V_{thresh}$. A delay in detection for overcurrent protection due to the time constant of the low-pass filter can be eliminated and the number of component parts can be reduced. Also, the current consumption can be reduced since the correction voltage Vc is selectively supplied by using the correction voltage switching element 14 only when necessary.

Embodiment 6

Figure 9:
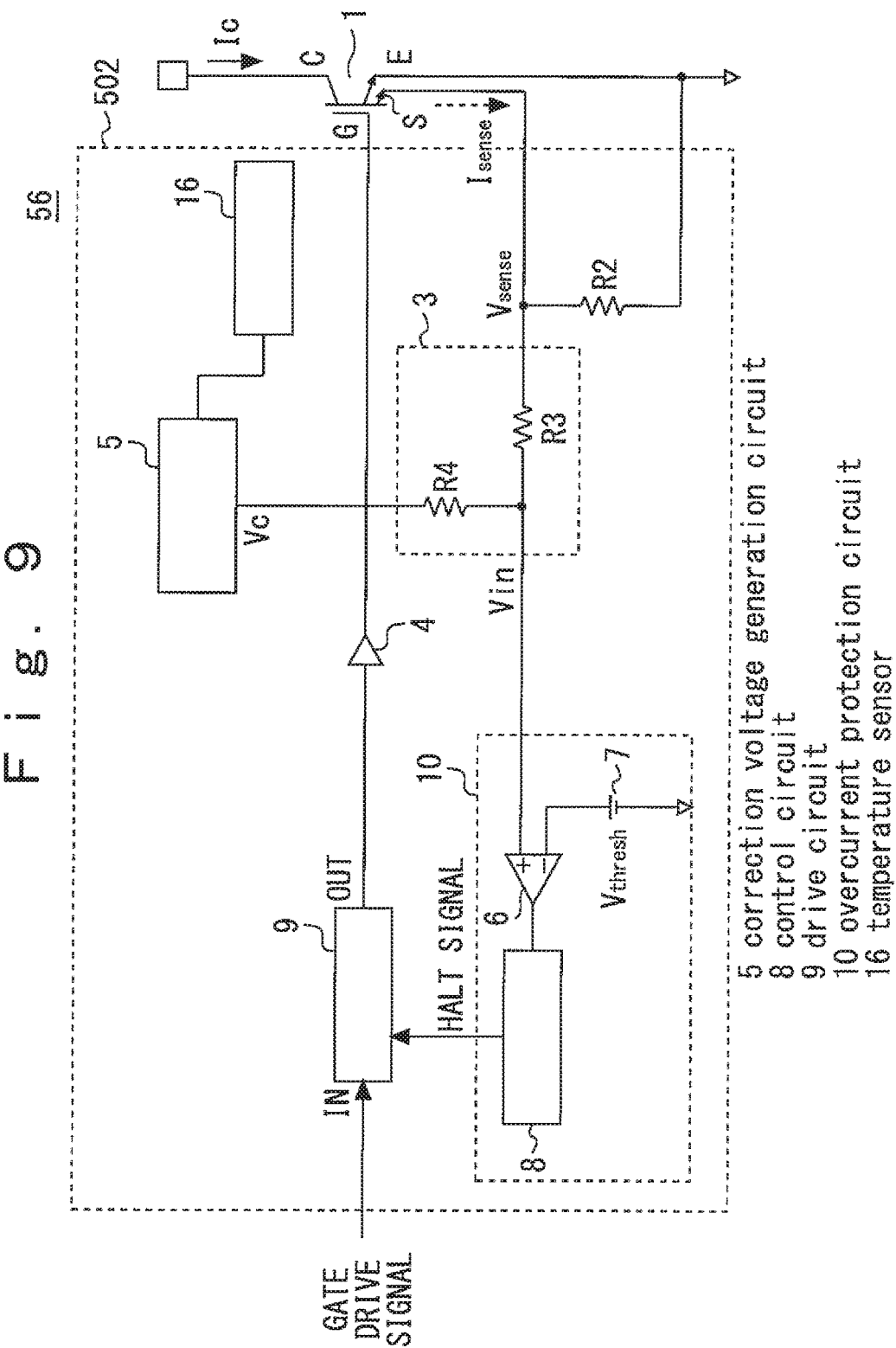
FIG. 9 is a diagram showing a semiconductor device and a semiconductor switching element drive device according to Embodiment 6 of the present invention.

FIG. 9 is a diagram showing a semiconductor device 56 and a semiconductor switching element drive device 502 according to Embodiment 6 of the present invention. The semiconductor device 56 and the drive device 502 are same as the semiconductor device 51 and the drive device 2 according to Embodiment 1 except that a temperature sensor 16 is added.

The temperature sensor 16 measures the element temperature of the switching element 1. The correction voltage generation circuit 5 is connected to the temperature sensor 16 and outputs the correction voltage Vc with a negative temperature gradient on the basis of the output from the temperature sensor 16 such that the correction voltage Vc lowers if the element temperature is reduced.

In general, the sense voltage $V_{sense}$ from the switching element 1 tends to rise along a positive temperature gradient with increase in the element temperature. The SC trip level tends to change along a negative temperature gradient reverse to that of the sense voltage.

The correction voltage generation circuit 5 changes the correction voltage Vc in proportion to the element temperature of the switching element 1 designated by the output from the temperature sensor 16. The negative temperature gradient reverse to the sense voltage $V_{sense}$ temperature characteristic can thereby be given to the correction voltage Vc. As a result, the temperature gradient of the corrected sense voltage Vin is reduced by being canceled out. The amount of reduction in SC trip level according to an increase in element temperature is reduced, ideally enabling the SC trip level to be constantly maintained even when the element temperature is changed.

Embodiment 7

Figure 10:
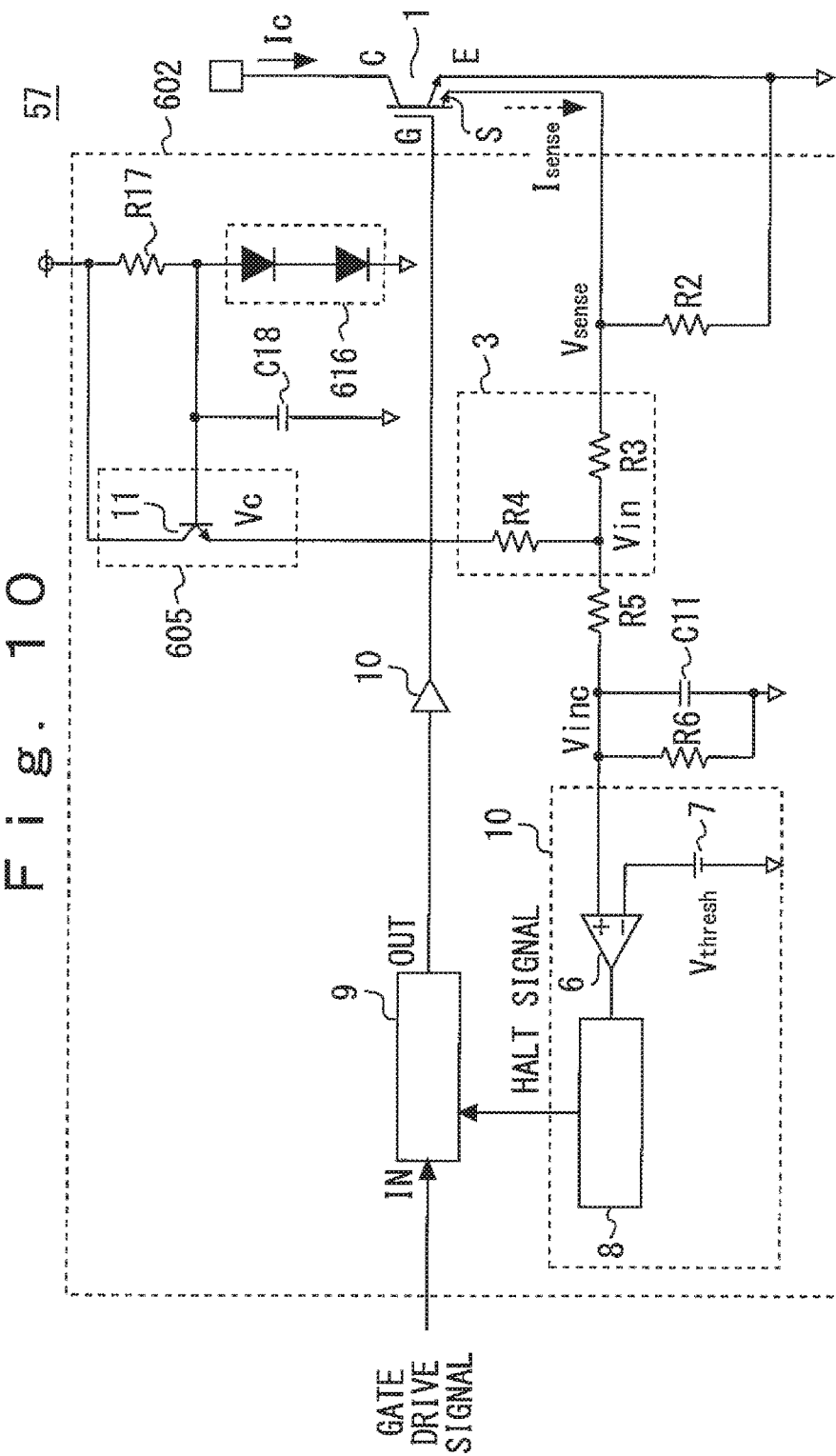
FIG. 10 is a diagram showing a semiconductor device and a semiconductor switching element drive device according to Embodiment 7 of the present invention.

FIG. 10 is a diagram showing a semiconductor device 57 and a semiconductor switching element drive device 602 according to Embodiment 7 of the present invention. The semiconductor device 57 and the drive device 602 are same as the semiconductor device 54 and the drive device 302 according to Embodiment 4 except that the correction voltage generation circuit 5 is replaced with a correction voltage generation circuit 605, and that a temperature sensor 616, a resistor R17 and a capacitive element C18 are added.

The correction voltage generation circuit 605 includes the NPN transistor 11 as an emitter follower. Excepting the circuit to which the base terminal of the NPN transistor 11 is connected, the correction voltage generation circuit 605 is the same as the correction voltage generation circuit 105.

The base terminal of the NPN transistor 11 is connected to one end of the resistor R17. The other end of the resistor R17 is connected to a voltage source. One end of the capacitive element C18 is connected between the resistor R17 and the base terminal of the NPN transistor 11. The other end of the capacitive element C18 is grounded.

The temperature sensor 616 is connected between the resistor R17 and the base terminal of the NPN transistor 11. The temperature sensor 616 is a plurality of temperature sensor diodes connected in series. The anode of the temperature sensor diode in the uppermost stage is connected to the base terminal of the NPN transistor 11. Because the forward voltage of the diodes has a negative gradient with respect to change in temperature, it is suitable for temperature correction voltage to be input to the base terminal of the emitter follower circuit formed by the NPN transistor 11.

The plurality of temperature sensor diodes provided in the temperature sensor 616 may be formed in the vicinity of a heat generating portion on the semiconductor chip of the switching element 1.

In Embodiment 7, the functions of the correction voltage generation circuit 605 and the temperature sensor 616 can be realized by means of a simple circuit.

The temperature gradient of the corrected sense voltage Vin is set to zero by selecting the resistance voltage dividing ratio in the voltage dividing circuit 3 so that the difference between the temperature gradients of the term $V_{sense}$ and the term Vc in expression (4) shown above is zero. Doing so, however, entails a possibility of failure to generate the corrected sense voltage Vin so that the corrected sense voltage Vin and the threshold voltage $V_{thresh}$ coincide with each other at a certain SC trip level to be set, because the ratio of the resistance values of the resistors R3 and R4 in the voltage dividing circuit 3 is fixed at a certain suitable value.

Then the resistance voltage dividing circuit formed by the filter resistor R5 and the resistor R6, as described in the description of Embodiment 4, is added to generate the recorrected sense voltage Vinc from the corrected sense voltage Vin with the temperature gradient set to zero, and the recorrected sense voltage Vinc is input to the overcurrent protection circuit 10. Consequently, while the resistance voltage dividing ratio in the voltage dividing circuit 3 is optimized so that the difference between the temperature gradients of the term $V_{sense}$ and the term Vc in expression (4) shown above is zero, the resistance values of the filter resistor R5 and the resistor R6 can be adjusted so that the threshold voltage $V_{thresh}$ and the recorrected sense voltage Vinc coincide with each other at a certain SC trip level to be set.

Figure 11:
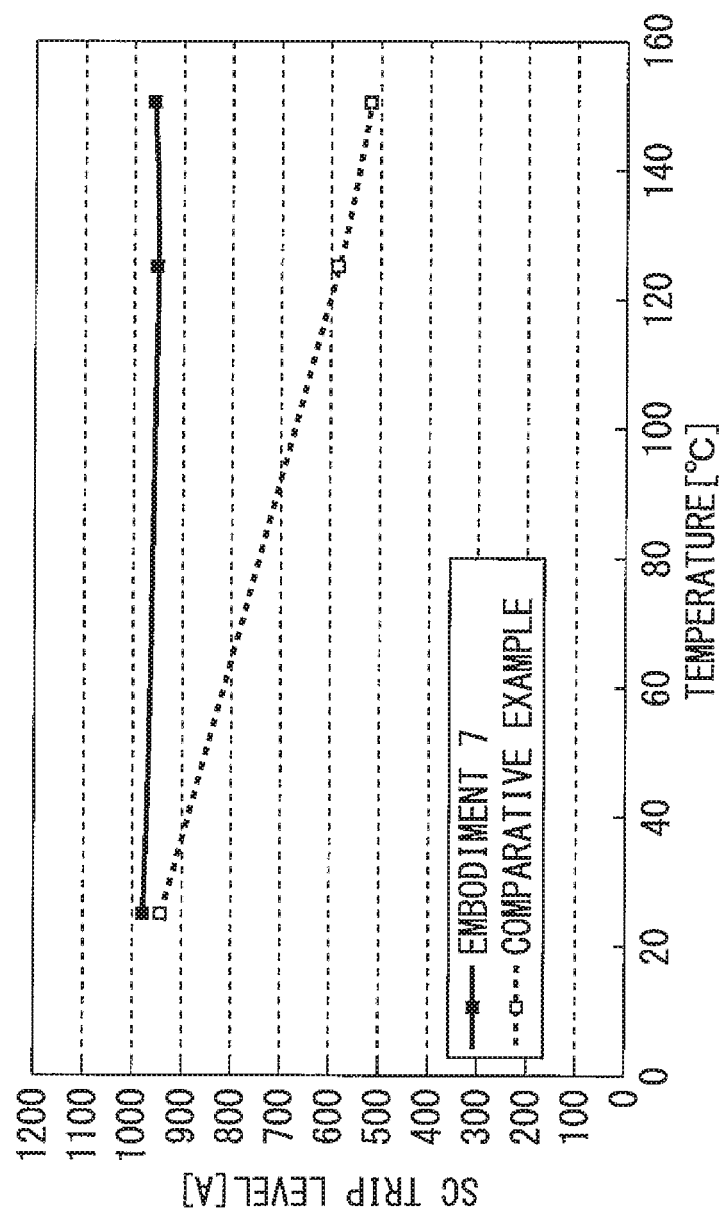
FIG. 11 is a diagram showing results of measurement of the SC trip level in the semiconductor device and the semiconductor switching element drive device according to Embodiment 7 of the present invention.

FIG. 11 is a diagram showing results of measurement of the SC trip level in the semiconductor device 57 and the semiconductor switching element drive device 602 according to Embodiment 7 of the present invention. The value of the sense resistor R2 is adjusted so that the SC trip levels in the circuit according to Embodiment 7 and a circuit according to a comparative example coincide with each other at ordinary temperature 25° C. The comparative example is the circuit shown in FIG. 15. In the comparative example, the SC trip level lowers with increase in the element temperature. In contrast, in Embodiment 7, the SC trip level can be maintained generally constantly even when the element temperature is changed.

Embodiment 8

Figure 12:
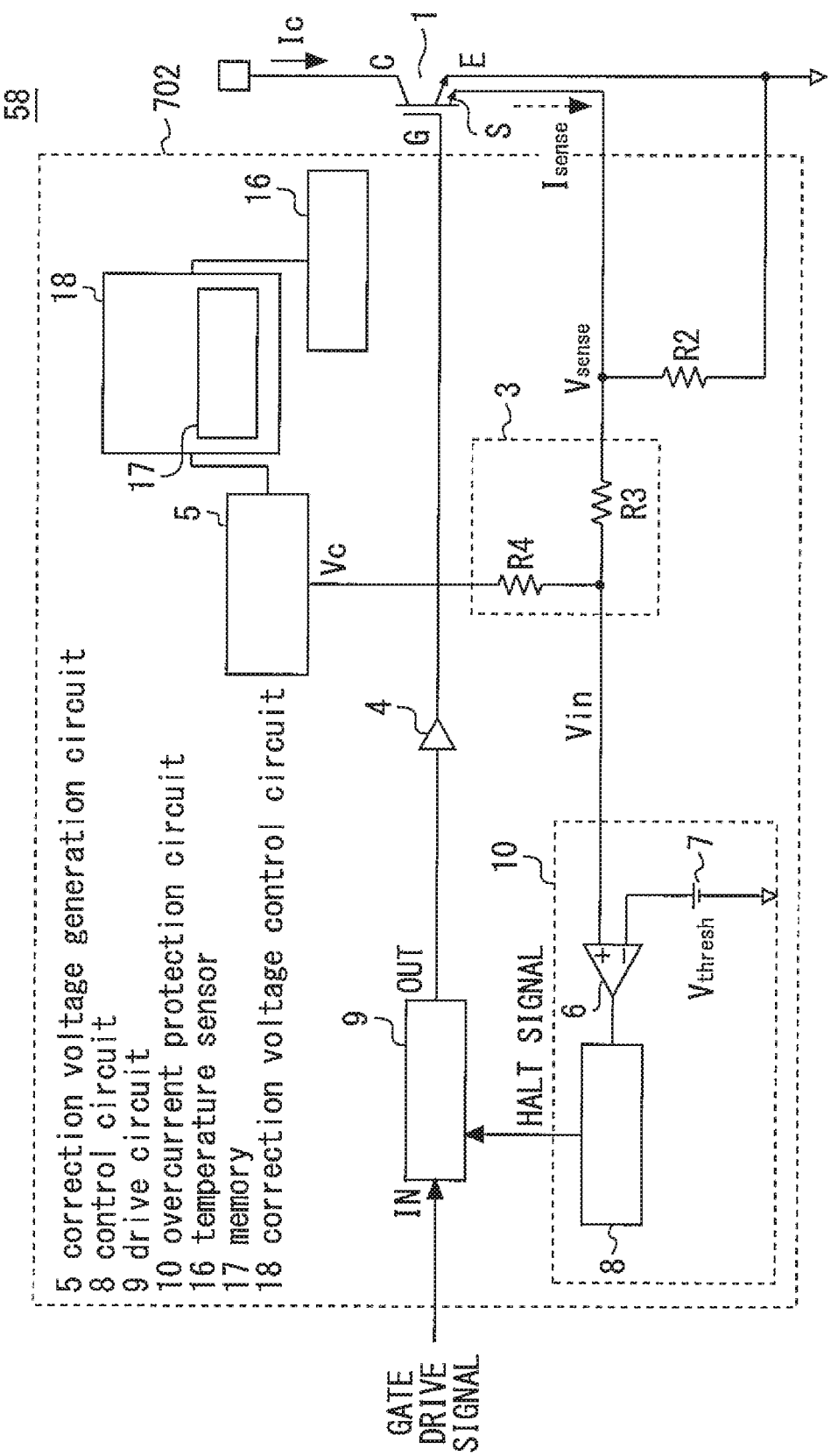
FIG. 12 is a diagram showing a semiconductor device and a semiconductor switching element drive device according to Embodiment 8 of the present invention.

FIG. 12 is a diagram showing a semiconductor device 58 and a semiconductor switching element drive device 702 according to Embodiment 8 of the present invention. The semiconductor device 58 and the drive device 702 are same as the semiconductor device 56 and the drive device 502 according to Embodiment 6 except that a correction voltage control circuit 18 is provided between the temperature sensor 16 and the correction voltage generation circuit 5.

The correction voltage control circuit 18 is a microprocessor which controls the correction voltage generation circuit 5 in accordance with a predetermined program to change the correction voltage according to the element temperature. The correction voltage control circuit 18 controls the correction voltage generation circuit 5 in accordance with computation formula or a map incorporated in the program to change the correction voltage Vc according to the element temperature of the switching element 1.

The correction voltage control circuit 18 includes a memory 17. Correction voltage values for realizing predetermined SC trip levels are written in the memory 17.

An SC trip level for one semiconductor device 58 is computed by using expression (1) or expression (4). The computed SC trip level is compared with a standard SC trip level and an amount of deviation ΔSC therebetween is computed.

Subsequently, the value of the correction voltage Vc is adjusted by DA outputting a suitable one of the correction voltage values from the memory 17 so that the amount of deviation ΔSC becomes zero, thereby generating the corrected sense voltage Vin as a result of correcting variation in the sense voltage $V_{sense}$ from the switching element 1. In the case of Embodiment 7, the recorrected sense voltage Vinc is generated.

A control signal from the correction voltage control circuit 18 is set such that the correction voltage generation circuit 5 is made to continue outputting the suitable correction voltage Vc determined at this time. The SC trip level is thereby made coincident with the standard SC trip level, thus enabling reducing variations in the SC trip level.

Also, the SC trip level temperature gradient with respect to change in the element temperature can be computed from SC trip levels under different temperature conditions. The SC trip level can be given the desired gradient by finely adjusting the correction voltage Vc according to changes in the element temperature detected with the temperature sensor 16. The correction value for realizing this temperature gradient is written in the memory 17. The value suitable for the desired temperature gradient is read out and used. The gradient of the SC trip level with respect to change in temperature can thereby be made generally constant, thus reducing variations in the SC trip level with further improved accuracy.

The above-described SC trip level adjustment can be performed by desired timing, for example, at a time before product shipment of each of semiconductor devices 58. The SC trip levels can thereby be adjusted according to the standard characteristic even if there are variations in characteristics of the switching elements 1.

Embodiment 9

Configuration of Device According to Embodiment 9

FIG. 13 is a diagram showing a semiconductor device 59 and a semiconductor switching element drive device 802 according to Embodiment 9 of the present invention. The semiconductor device 59 and the drive device 802 are the same as the semiconductor device 51 and the drive device 2 according to Embodiment 1 except that a high-speed protection circuit 804 is provided.

One end of the high-speed protection circuit 804 is connected to the gate terminal of the switching element 1, and the other end is connected to the sense terminal S. The high-speed protection circuit 804 reduces the gate voltage $V_{GE}$ on the switching element 1 when the sense voltage $V_{sense}$ reaches a second threshold voltage. This second threshold voltage is a gate threshold voltage of a MOSFET 19 for shutting off the gate of the switching element 1.

More specifically, in the present embodiment, the high-speed protection circuit 804 is a so-called real time control (RTC) circuit. The high-speed protection circuit 804 includes a resistor R21, a capacitive element C20 and the MOSFET 19. One end of the resistor R21 is connected to the gate terminal of the switching element 1. A bipolar transistor may be used for the MOSFET 19.

The other end of the resistor R21 is connected to a drain terminal of the MOSFET 19. A gate terminal of the MOSFET 19 is connected between the sense terminal S and the resistor R3. A source terminal of the MOSFET 19 is grounded. One end of the capacitive element C20 is connected to the gate terminal of the MOSFET 19. The other end of the capacitive element C20 is grounded. The capacitive element C20 is used for stabilization of the gate voltage on the MOSFET 19. However, use of the capacitive element C20 may be avoided for simplification of the circuit.

In the high-speed protection circuit 804, the MOSFET 19 is turned on when the sense voltage $V_{sense}$ exceeds the gate threshold voltage of the MOSFET 19, thereby reducing the gate voltage on the semiconductor switching element 1 without any action via the overcurrent protection circuit 10. Therefore, a delay caused by the comparator 6 and the low-pass filter on the overcurrent protection circuit 10 side, for example, can be avoided to enable high-speed startup. However, even when the high-speed protection circuit 804 operates, the gate is not completely shut off as long as the drive circuit 9 continues sending the output signal. Completely shutting off the gate requires stopping the drive circuit 9 by means of the overcurrent protection circuit 10.

Optimization of the operating conditions for the high-speed protection circuit 804 requires optimizing the value of the sense resistor R2 so that the values of the gate threshold voltage of the MOSFET 19 and the sense voltage $V_{sense}$ are made close to each other. This is because if the sense voltage $V_{sense}$ is close to the gate threshold voltage of the MOSFET 19, the MOSFET 19 can be immediately turned on when a rise of the sense voltage $V_{sense}$ occurs due to an overcurrent.

In a case where the sense voltage $V_{sense}$ is directly input to the comparator 6 in the overcurrent protection circuit 10 as in the conventional art, that is, in the case of the comparative example shown in FIG. 15, however, there is a need to determine with priority the sense resistor R2 for threshold voltage $V_{thresh}$=sense resistor R2×SC trip level in order to set the desired SC trip level. There is, therefore, a possibility of the gate threshold voltage of the MOSFET 19 being unnecessarily higher than the sense voltage $V_{sense}$.

In this respect, in Embodiment 9, the corrected sense voltage Vin can be generated by means of the correction voltage Vc and the voltage dividing circuit 3 independently of the resistance value of the sense resistor R2 to be input to the comparator 6. Consequently, while the resistance value of the sense resistor R2 is optimized so that the values of the gate threshold voltage of the MOSFET 19 and the sense voltage $V_{sense}$ are made close to each other, the correction voltage Vc and the values of the voltage dividing resistors in the voltage dividing circuit 3 can be adjusted so that the corrected sense voltage Vin meets the desired SC trip level. A speedup of the protecting operation of the high-speed protection circuit 804 can thus be achieved.

An arrangement in the high-speed protection circuit 804 may alternatively be adopted in which a diode (not shown) is inserted between the gate terminal of the MOSFET 19 and the sense terminal S; the cathode of the diode is connected to the gate terminal of the MOSFET 19; and the anode of the diode is connected to the sense terminal S. In this arrangement, even when the sense voltage $V_{sense}$ drops to 0 V, the gate voltage on the MOSFET 19 is held by the rectifying function of the diode and the MOSFET 19 is not immediately turned off. Therefore, the high-speed protection circuit 804 can maintain the state where the gate voltage on the semiconductor switching element 1 is reduced until the drive circuit 9 is stopped by the overcurrent protection circuit 10.

Modified Example of Embodiment 9

In Embodiment 9, the high-speed protection circuit 804 is added to the semiconductor device 51 and the semiconductor switching element drive device 2 according to Embodiment 1. The high-speed protection circuit 804 may also be added to the semiconductor devices 56 to 58 and the semiconductor switching element drive devices 502 to 702 according to Embodiments 6 to 8.

FIG. 14 is a diagram showing a semiconductor device 60 and a semiconductor switching element drive device 852 according to a modified example of Embodiment 9 of the present invention. Referring to FIG. 14, the high-speed protection circuit 804 is added to the semiconductor device 56 and the drive device 502 according to Embodiment 6. One end of the capacitive element C20 and the gate terminal of the MOSFET 19 in the high-speed protection circuit 804 are connected to the point of connection between the resistors R3 and R4 in the voltage dividing circuit 3.

In this case, the gate terminal of the MOSFET 19 may be connected to the point of connection between the resistors R3 and R4 in the voltage dividing circuit 3. By doing so, correction of the voltage for driving the high-speed protection circuit 804 (the voltage applied to the gate terminal of the MOSFET 19) according to the element temperature of the switching element 1 is enabled. However, there is a need to consider a delay due to the resistor R3, the capacitive element C20 and a capacitive component of the MOSFET 19.

An arrangement in the high-speed protection circuit 804 may alternatively be adopted in which a diode (not shown) is inserted between the gate terminal of the MOSFET 19 and the point of connection between the resistors R3 and R4 in the voltage dividing circuit 3; the cathode of the diode is connected to the gate terminal of the MOSFET 19; and the anode of the diode is connected to the point of connection between the resistors R3 and R4 in the voltage dividing circuit 3. In this arrangement, even when the corrected sense voltage $V_{sense}$ drops to 0 V, the gate voltage on the MOSFET 19 is held by the rectifying function of the diode and the MOSFET 19 is not immediately turned off. Therefore, the high-speed protection circuit 804 can maintain the state where the gate voltage on the semiconductor switching element 1 is reduced until the drive circuit 9 is stopped by the overcurrent protection circuit 10.

REFERENCE SIGNS LIST

1 switching element, 4 buffer, 5, 105, 605 correction voltage generation circuit, 6 comparator, 7 reference voltage generation circuit, 8 control circuit, 9 drive circuit, 10 overcurrent protection circuit, 11 transistor, 12 reference voltage source, 14 correction voltage switching element, 15 control circuit, 16 temperature sensor, 17 memory, 18 correction voltage control circuit, 19 MOSFET, 51, 52, 53, 54, 55, 56, 57, 58, 59, 60 semiconductor device, 2, 102, 202, 302, 402, 502, 602, 702, 802, 852 drive device, 616 temperature sensor, 804 high-speed protection circuit

The invention claimed is:
1. A semiconductor device comprising:
a semiconductor switching element having a sense terminal and capable of outputting from the sense terminal a sense current given at a predetermined shunt ratio to a main current;
a sense resistor having one end connected to the sense terminal, having the other end configured to be connected to a ground, and receiving a current from the sense terminal to generate a sense voltage;
a correction voltage generation circuit which generates a correction voltage;
a voltage dividing circuit including a first resistor which receives the sense voltage at its one end and a second resistor which receives at its one end the correction voltage from the correction voltage generation circuit, and whose other end is connected to the other end of the first resistor, the voltage dividing circuit outputting from the point of connection between the first and second resistors a corrected sense voltage obtained by correcting the sense voltage with the correction voltage;

an overcurrent protection circuit to which the corrected sense voltage is input, and which outputs a halt signal when the corrected sense voltage is higher than a threshold voltage;

a drive circuit which stops driving of the semiconductor switching element upon receiving the halt signal from the overcurrent protection circuit; and a correction voltage switching element which connects the correction voltage generation circuit and the one end of the second resistor, wherein the correction voltage switching element is turned on from an off state after a lapse of a predetermined time period from a moment at which the semiconductor switching element is turned on, and with the correction voltage switching element turned on, the correction voltage generation circuit is connected to the one end of the second resistor.

2. The semiconductor device according to claim 1, further comprising a temperature sensor for measuring the element temperature of the semiconductor switching element; and a correction voltage control circuit which controls the correction voltage generation circuit in accordance with a predetermined program to change the correction voltage according to the element temperature.

3. A semiconductor device comprising:

a semiconductor switching element having a sense terminal and capable of outputting from the sense terminal a sense current given at a predetermined shunt ratio to a main current;

a sense resistor having one end connected to the sense terminal, having the other end configured to be connected to a ground, and receiving a current from the sense terminal to generate a sense voltage;

a correction voltage generation circuit which generates a correction voltage;

a voltage dividing circuit including a first resistor which receives the sense voltage at its one end and a second resistor which receives at its one end the correction voltage from the correction voltage generation circuit, and whose other end is connected to the other end of the first resistor, the voltage dividing circuit outputting from the point of connection between the first and second resistors a corrected sense voltage obtained by correcting the sense voltage with the correction voltage;

an overcurrent protection circuit to which the corrected sense voltage is input, and which outputs a halt signal when the corrected sense voltage is higher than a threshold voltage;

a drive circuit which stops driving of the semiconductor switching element upon receiving the halt signal from the overcurrent protection circuit; and a temperature sensor for measuring the element temperature of the semiconductor switching element, wherein the correction voltage generation circuit reduces the correction voltage on the basis of an output from the temperature sensor if the element temperature is increased, and wherein the correction voltage generation circuit includes a transistor with a control terminal, a first terminal and a second terminal, the state of conduction through the first and second terminals being controlled with the control terminal, and wherein an electric power from a voltage source is supplied to the first terminal, and the correction voltage is output from the second terminal; and the temperature sensor includes a temperature sensor diode having an anode, a voltage of the anode being supplied to the control terminal, and the temperature sensor diode having a cathode configured to be connected to the ground.

4. The semiconductor device according to claim 3, further comprising a temperature sensor for measuring the element temperature of the semiconductor switching element; and a correction voltage control circuit which controls the correction voltage generation circuit in accordance with a predetermined program to change the correction voltage according to the element temperature.

* * * * *